United States Patent
Liu et al.

(10) Patent No.: US 9,837,604 B2
(45) Date of Patent: Dec. 5, 2017

(54) PHASE-CHANGE MEMORY CELL IMPLANT FOR DUMMY ARRAY LEAKAGE REDUCTION

(71) Applicant: Intel Corporation, Santa Clara, CA (US)

(72) Inventors: Lequn J. Liu, Boise, ID (US); Ugo Russo, Boise, ID (US); Max F. Hineman, Boise, ID (US)

(73) Assignee: INTEL CORPORATION, Santa Clara, CA (US)

( * ) Notice: Subject to any disclaimer, the term of this patent is extended or adjusted under 35 U.S.C. 154(b) by 0 days.

(21) Appl. No.: 15/399,701

(22) Filed: Jan. 5, 2017

(65) Prior Publication Data

US 2017/0125671 A1 May 4, 2017

Related U.S. Application Data

(62) Division of application No. 14/581,921, filed on Dec. 23, 2014, now Pat. No. 9,559,146.

(51) Int. Cl.
*H01L 45/00* (2006.01)
*H01L 27/24* (2006.01)

(52) U.S. Cl.
CPC .......... *H01L 45/06* (2013.01); *H01L 27/2463* (2013.01); *H01L 45/1233* (2013.01);
(Continued)

(58) Field of Classification Search
CPC . H01L 45/06; H01L 45/1233; H01L 45/1253; H01L 45/141; H01L 45/1608;
(Continued)

(56) References Cited

U.S. PATENT DOCUMENTS

2008/0157053 A1 7/2008 Lai et al.
2009/0122588 A1 5/2009 Chen
(Continued)

FOREIGN PATENT DOCUMENTS

JP 2005-522045 A 7/2005

OTHER PUBLICATIONS

International Search Report and Written Opinion mailed Mar. 4, 2016, issued in corresponding International Application No. PCT/US2015/061974, 14 pages.
(Continued)

*Primary Examiner* — Thao X Le
*Assistant Examiner* — Gardner W Swan
(74) *Attorney, Agent, or Firm* — Schwabe Williamson & Wyatt PC

(57) ABSTRACT

Embodiments of the present disclosure describe phase-change memory cell implant for dummy array leakage reduction. In an embodiment, an apparatus includes a plurality of phase-change memory (PCM) elements, wherein individual PCM elements of the plurality of PCM elements are dummy cells including a bottom electrode layer, a select device layer disposed on the bottom electrode layer, a middle electrode layer disposed on the select device layer, a phase-change material layer disposed on the middle electrode layer, and a top electrode layer disposed on the phase-change material layer, wherein the phase-change material layer is doped with an impurity to reduce cell leakage of the dummy cells. Other embodiments may be described and/or claimed.

8 Claims, 4 Drawing Sheets

(52) U.S. Cl.
CPC ........ *H01L 45/1253* (2013.01); *H01L 45/141* (2013.01); *H01L 45/165* (2013.01); *H01L 45/1608* (2013.01); *H01L 45/1675* (2013.01)

(58) Field of Classification Search
CPC .......................... H01L 45/165; H01L 45/1675; H01L 27/2763
See application file for complete search history.

(56) References Cited

U.S. PATENT DOCUMENTS

| | | |
|---|---|---|
| 2009/0190393 A1 | 7/2009 | Kang et al. |
| 2011/0069531 A1 | 3/2011 | Aburada et al. |
| 2014/0217349 A1 | 8/2014 | Hopkins |
| 2015/0029775 A1 | 1/2015 | Ravasio et al. |
| 2015/0104921 A1 | 4/2015 | Terai et al. |

OTHER PUBLICATIONS

Search Report of R.O.C. mailed Oct. 20, 2016, issued in corresponding TW Patent Application No. 104138579, 2 pages.
Lai, Y.F., et al., "Stacked Chalcogenide Layers Used as Multi-State Storage Medium for Phase Change Memory," Appl. Phys. A 84, 21-25 (2006), DOI: 10.1007/s00339-006-3571-7, 6 pages.
Non-Final Office Action mailed Mar. 30, 2016, issued in corresponding U.S. Appl. No. 14/581,921, filed Dec. 23, 2014, 14 pages.
Notice of Allowance mailed Oct. 3, 2016, issued in corresponding U.S. Appl. No. 14/581,921, filed Dec. 23, 2014, 11 pages.
International Preliminary Report on Patentability dated Jul. 6, 2017 issued in corresponding International Application No. PCT/US2015/061974, 8 pages.

US 9,837,604 B2

PHASE-CHANGE MEMORY CELL IMPLANT FOR DUMMY ARRAY LEAKAGE REDUCTION

CROSS-REFERENCE TO RELATED APPLICATION

This application is a division of U.S. application Ser. No. 14/581,921, filed Dec. 23, 2014, and entitled "PHASE-CHANGE MEMORY CELL IMPLANT FOR DUMMY ARRAY LEAKAGE REDUCTION," the disclosure of which is hereby incorporated by reference herein in its entirety for all purposes.

FIELD

Embodiments of the present disclosure generally relate to the field of integrated circuits, and more particularly, to phase-change memory cell implant for dummy array leakage reduction.

BACKGROUND

Phase-change memory (PCM) technology such as multi-stack cross-point PCM is a promising alternative to other non-volatile memory (NVM) technology. Currently, non-uniform chemical-mechanical polishing (CMP) or other issues such as loading effects may result in vertical cell leakage from an array of cells including, for example, dummy cells of the array.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

DETAILED DESCRIPTION

Embodiments of the present disclosure describe phase-change memory cell implant for dummy array leakage reduction. In the following detailed description, reference is made to the accompanying drawings which form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous. The term "coupled" may refer to a direct connection, an indirect connection, or an indirect communication.

As used herein, the term "module" may refer to, be part of, or include an Application Specific Integrated Circuit (ASIC), an electronic circuit, a processor (shared, dedicated, or group) and/or memory (shared, dedicated, or group) that execute one or more software or firmware programs, a combinational logic circuit, a state machine, and/or other suitable components that provide the described functionality.

Figure 1:
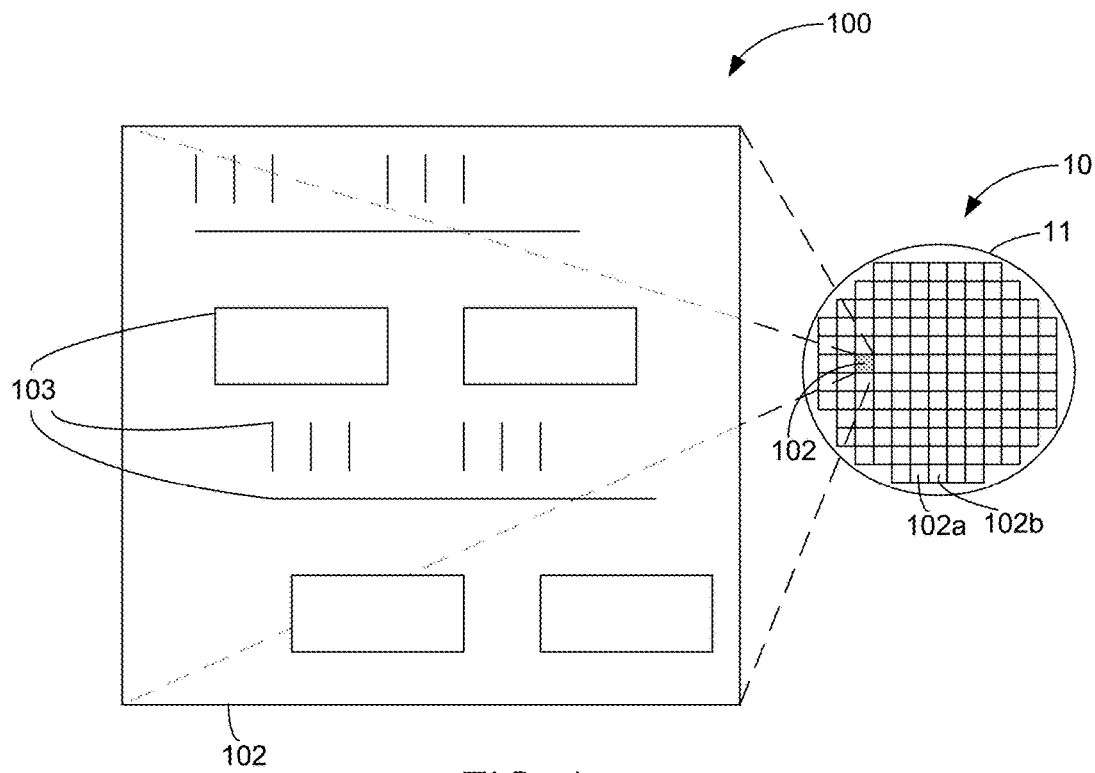
FIG. 1 schematically illustrates a top view of an example die in wafer form and in singulated form, in accordance with some embodiments.

FIG. 1 schematically illustrates a top view of an example die 102 in wafer form 10 and in singulated form 100, in accordance with some embodiments. In some embodiments, the die 102 may be one of a plurality of dies (e.g., dies 102, 102a, 102b) of a wafer 11 composed of semiconductor material such as, for example, silicon or other suitable material. The plurality of dies may be formed on a surface of the wafer 11. Each of the dies may be a repeating unit of a semiconductor product that includes a phase-change memory (PCM) device as described herein. For example, the die 102 may include circuitry 103 of a PCM device in accordance with some embodiments. According to various embodiments, the circuitry 103 may include one or more PCM elements (e.g., cells), which may be configured in an array. The PCM elements may include, for example, a phase-change material such as a chalcogenide glass that can be switched between crystalline and amorphous states with the application of heat produced by an electric current. The state (e.g., crystalline/amorphous) of the phase-change material may correspond with a logical value (e.g., 1 or 0) of the PCM elements. The circuitry 103 may be part of a PCM and switch (PCMS) device in some embodiments. That is, the PCM elements may include a switch such as, for example, an ovonic threshold switch (OTS) configured for use in selection/programming operations of the PCM elements. In some embodiments, the circuitry 103 may include dummy cells doped with an impurity as described herein.

The circuitry 103 may further include one or more bit-lines and one or more word-lines coupled to the PCM elements. The bit-lines and word-lines may be configured such that each of the PCM elements is disposed at an intersection of each individual bit-line and word-line, in some embodiments. A voltage or bias can be applied to a target PCM element of the PCM elements using the word-lines and the bit-lines to select the target cell for a read or write operation. Bit-line drivers may be coupled to the bit-lines and word-line drivers may be coupled to the word-lines to facilitate decoding/selection of the PCM elements. Capacitors and resistors may be coupled to the bit-lines and the word-lines. The circuitry 103 may include other suitable devices and configurations in some embodiments. For example, the circuitry 103 may include one or more modules configured to perform read, program, verify and/or analysis operations.

In some embodiments, the circuitry 103 may be formed using PCM fabrication techniques and/or other suitable semiconductor fabrication techniques. It is noted that the circuitry 103 is only schematically depicted in FIG. 1 and may represent a wide variety of suitable logic or memory in the form of circuitry including, for example, one or more state machines including circuitry and/or instructions in storage (e.g., firmware or software) configured to perform actions such as read, program, verify and/or analysis operations.

After a fabrication process of the semiconductor product is complete, the wafer 11 may undergo a singulation process in which each of the dies (e.g., dies 102, 102a, 102b) is separated from one another to provide discrete "chips" of the semiconductor product. The wafer 11 may be any of a variety of sizes. In some embodiments, the wafer 11 has a diameter ranging from about 25.4 mm to about 450 mm. The wafer 11 may include other sizes and/or other shapes in other embodiments. According to various embodiments, the circuitry 103 may be disposed on a semiconductor substrate in wafer form 10 or singulated form 100. In some embodiments, the die 102 may include logic or memory, or combinations thereof.

Figure 2:
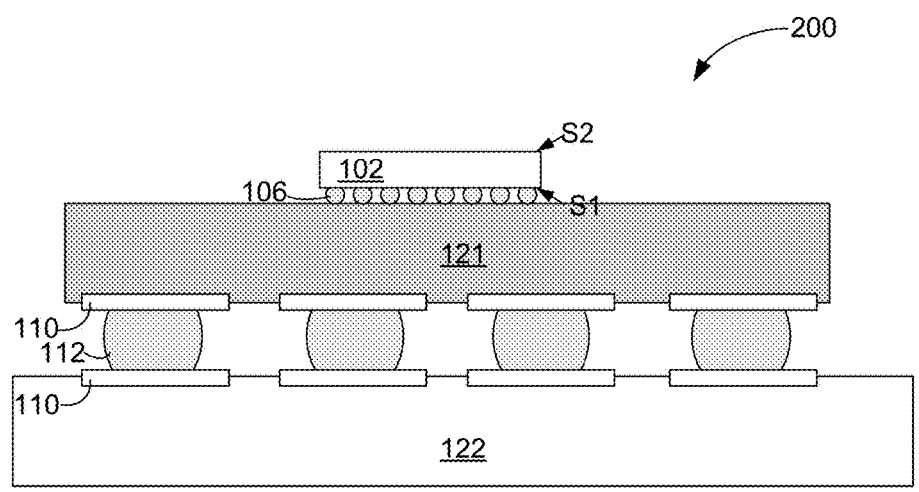
FIG. 2 schematically illustrates a cross-section side view of an integrated circuit (IC) assembly, in accordance with some embodiments.

FIG. 2 schematically illustrates a cross-section side view of an integrated circuit (IC) assembly 200, in accordance with some embodiments. In some embodiments, the IC assembly 200 may include one or more dies (hereinafter "die 102") electrically and/or physically coupled with a package substrate 121. The die 102 may include circuitry (e.g., circuitry 103 of FIG. 1) such as a PCM device (e.g., PCM device 300 of FIG. 3) as described herein. In some embodiments, the package substrate 121 may be coupled with a circuit board 122, as can be seen.

The die 102 may represent a discrete product made from a semiconductor material (e.g., silicon) using semiconductor fabrication techniques such as thin film deposition, lithography, etching and the like used in connection with forming PCM devices. In some embodiments, the die 102 may be, include, or be a part of a processor, memory, system-on-chip (SoC) or ASIC in some embodiments. In some embodiments, an electrically insulative material such as, for example, molding compound or underfill material (not shown) may encapsulate at least a portion of the die 102 and/or die-level interconnect structures 106.

The die 102 can be attached to the package substrate 121 according to a wide variety of suitable configurations including, for example, being directly coupled with the package substrate 121 in a flip-chip configuration, as depicted. In the flip-chip configuration, an active side, S1, of the die 102 including active circuitry is attached to a surface of the package substrate 121 using die-level interconnect structures 106 such as bumps, pillars, or other suitable structures that may also electrically couple the die 102 with the package substrate 121. The active side S1 of the die 102 may include circuitry such as, for example, PCM elements. An inactive side, S2, may be disposed opposite to the active side S1, as can be seen. In other embodiments, the die 102 may be disposed on another die that is coupled with the package substrate 121 in any of a variety of suitable stacked die configurations. For example, a processor die may be coupled with the package substrate 121 in a flip-chip configuration and the die 102 may be mounted on the processor die in a flip-chip configuration and electrically coupled with the package substrate using through-silicon vias (TSVs) formed through the processor die. In still other embodiments, the die 102 may be embedded in the package substrate 121 or coupled with a die that is embedded in the package substrate 121. Other dies may be coupled with the package substrate 121 in a side-by-side configuration with the die 102 in other embodiments.

In some embodiments, the die-level interconnect structures 106 may be configured to route electrical signals between the die 102 and the package substrate 121. The electrical signals may include, for example, input/output (I/O) signals and/or power/ground signals that are used in connection with operation of the die. The die-level interconnect structures 106 may be coupled with corresponding die contacts disposed on the active side S1 of the die 102 and corresponding package contacts disposed on the package substrate 121. The die contacts and/or package contacts may include, for example, pads, vias, trenches, traces and/or other suitable contact structures.

In some embodiments, the package substrate 121 is an epoxy-based laminate substrate having a core and/or build-up layers such as, for example, an Ajinomoto Build-up Film (ABF) substrate. The package substrate 121 may include other suitable types of substrates in other embodiments including, for example, substrates formed from glass, ceramic, or semiconductor materials.

The package substrate 121 may include electrical routing features configured to route electrical signals to or from the die 102. The electrical routing features may include, for example, package contacts (e.g., pads 110) disposed on one or more surfaces of the package substrate 121 and/or internal routing features (not shown) such as, for example, trenches, vias or other interconnect structures to route electrical signals through the package substrate 121.

The circuit board 122 may be a printed circuit board (PCB) composed of an electrically insulative material such as an epoxy laminate. For example, the circuit board 122 may include electrically insulating layers composed of materials such as, for example, polytetrafluoroethylene, phenolic cotton paper materials such as Flame Retardant 4 (FR-4), FR-1, cotton paper and epoxy materials such as CEM-1 or CEM-3, or woven glass materials that are laminated together using an epoxy resin prepreg material. Interconnect structures (not shown) such as traces, trenches, vias may be formed through the electrically insulating layers to route the electrical signals of the die 102 through the circuit board 122. The circuit board 122 may be composed of other suitable materials in other embodiments. In some embodiments, the circuit board 122 is a motherboard (e.g., motherboard 702 of FIG. 7).

Package-level interconnects such as, for example, solder balls 112 may be coupled to pads 110 on the package substrate 121 and/or on the circuit board 122 to form corresponding solder joints that are configured to further route the electrical signals between the package substrate 121 and the circuit board 122. The pads 110 may be composed of any suitable electrically conductive material such as metal including, for example, nickel (Ni), palladium (Pd), gold (Au), silver (Ag), copper (Cu), and combinations thereof. The package-level interconnect may include other structures and/or configurations including, for example, land-grid array (LGA) structures and the like.

The IC assembly 200 may include a wide variety of other suitable configurations in other embodiments including, for example, suitable combinations of flip-chip and/or wirebonding configurations, interposers, multi-chip package configurations including system-in-package (SiP) and/or package-on-package (PoP) configurations. Other suitable techniques to route electrical signals between the die 102 and other components of the IC assembly 200 may be used in some embodiments.

Figure 3:
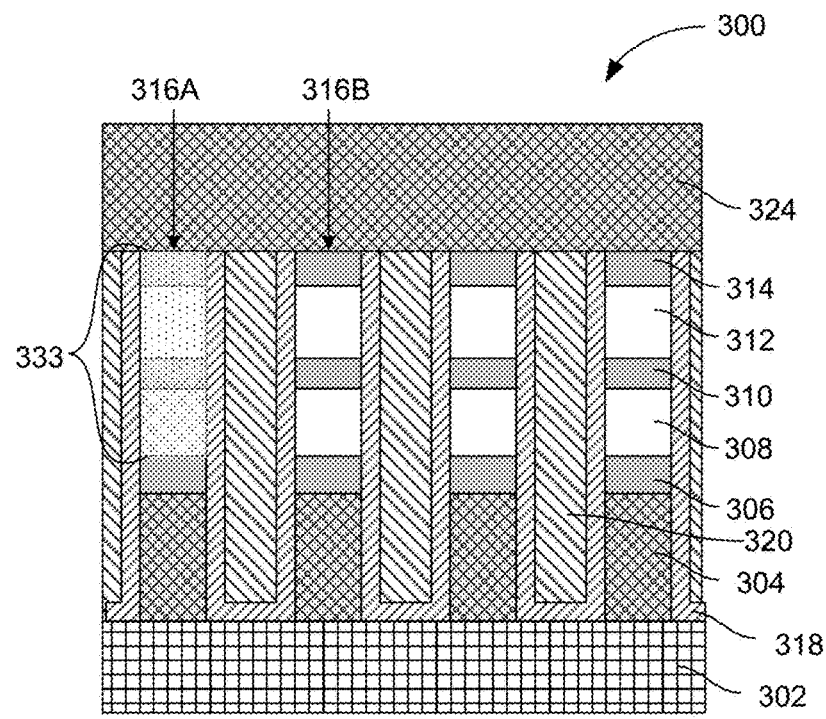
FIG. 3 schematically illustrates a cross-section side view of a PCM device, in accordance with some embodiments.

FIG. 3 schematically illustrates a cross-section side view of a PCM device 300, in accordance with some embodiments. According to various embodiments, the PCM device 300 may include a plurality of PCM elements (e.g., individual PCM elements 316A, 316B) formed on a substrate 302. The individual PCM elements 316A, 316B may correspond with cells of an array of cells of the PCM device.

In some embodiments, the individual PCM element 316A may represent a dummy cell and individual PCM element 316B may represent an active cell of the plurality of cells. A dummy cell may be a cell that is not intended or designated to store information of the PCM device 300, but may be otherwise formed for memory array structural health or other reasons. For example, in some embodiments, dummy cells may be used for electrical or physical isolation of active cells. Dummy cells may include, for example, cells at an edge of a tile that are not configured for storage as a result of differences in electrical characteristic (e.g., threshold voltage, Vt) in the dummy cells that are different (e.g., greater Vt) from normal active cells, for example, by a pre-determined amount. Such dummy cells may be particularly affected by chemical-mechanical polish (CMP) in a manner that adversely affects electrical performance of the dummy cells relative to active cells. The dummy cells may be placed in other areas other than at an edge of a tile in some embodiments. In some embodiments, the dummy cells may be biased together with active cells during normal operation (e.g., when an active cell is selected, which shares a same bit-line or word-line as the dummy cell) and the dummy cells may leak vertically (e.g., from bit-line 324 to word-line 304). In some embodiments, the dummy cells may be biased slightly differently than active cells resulting in potentially greater leakage through the dummy cells than the active cells.

According to various embodiments, the dummy cells (e.g., individual PCM element 316A) may be part of a subset of cells of the PCM device that are doped with an impurity 333 to reduce cell leakage of the dummy cells. The dummy cells may be doped, for example, by an implant process that may damage layers (e.g., layers 306, 308, 310, 312, 314) or interfaces between the layers to shift a threshold voltage (Vt) of the damaged dummy cell high enough to shut down the dummy cell and/or reduce the dummy cell leakage at normal Vt for active cells.

According to various embodiments, each of the individual PCM elements 316A, 316B may include a stack of layers disposed on a word-line 304. Although not shown, one or more intervening layers and/or structures (e.g., circuitry) may be disposed between the substrate 302 and the word-line 304. For example, the circuitry may include complementary metal-oxide-semiconductor (CMOS) devices and/or metallization that is formed on the substrate 302 between the word-line 304 and the substrate 302. In some embodiments, the circuitry may include a charge pump and/or select circuitry. The substrate 302 may be a semiconductor substrate such as, for example, silicon in some embodiments. The word-line 304 may include, for example, tungsten. Other suitable materials for the substrate 302 and the word-line 304 may be used in other embodiments.

In some embodiments, the individual PCM elements 316A, 316B may each include a select device (SD) layer 308 and a phase-change material (PM) layer 312 disposed between electrodes. For example, in the depicted embodiment, the SD layer 308 may be disposed on a bottom electrode layer 306 that may be formed on the word-line 304. A middle electrode layer 310 may be disposed on the SD layer 308. The PM layer 312 may be disposed on the middle electrode layer 310 and a top electrode layer 314 may be disposed on the PM layer 312. The individual PCM elements 316A, 316B may include other intervening materials and/or layers according to various embodiments, including, for example, diffusion barrier layers between chalcogenide material of the SD layer 308 and PM layer 312 and material of the electrodes 306, 310, 314. In other embodiments, the stack of layers may be arranged in other configurations. For example, in one embodiment, the PM layer 312 may be disposed on the bottom electrode layer 306, the middle electrode layer 310 may be disposed on the PM layer 312, the SD layer 308 may be disposed on the middle electrode layer 310, and the top electrode layer may be disposed on the SD layer 308. That is, in the depicted configuration, the PM layer 312 and the SD layer 308 may be switched.

According to various embodiments, one or more of the layers 306, 308, 310, 312, 314 of the individual PCM element 316A may be doped with the impurity 333 to reduce leakage. In some embodiments, the PM layer 312 may be doped with an impurity 333 to reduce cell leakage of the dummy cells. Implant species (e.g., impurity 333) in the PM layer 312 may also reduce PM element diffusion at the interface during thermal treatment such that PM material segregation can be suppressed and Bit error rate (BER) can be improved for the whole cell performance. In some embodiments, either or both of beam line implant and/or plasma implant technologies may be used for the implant process.

Figure 4:
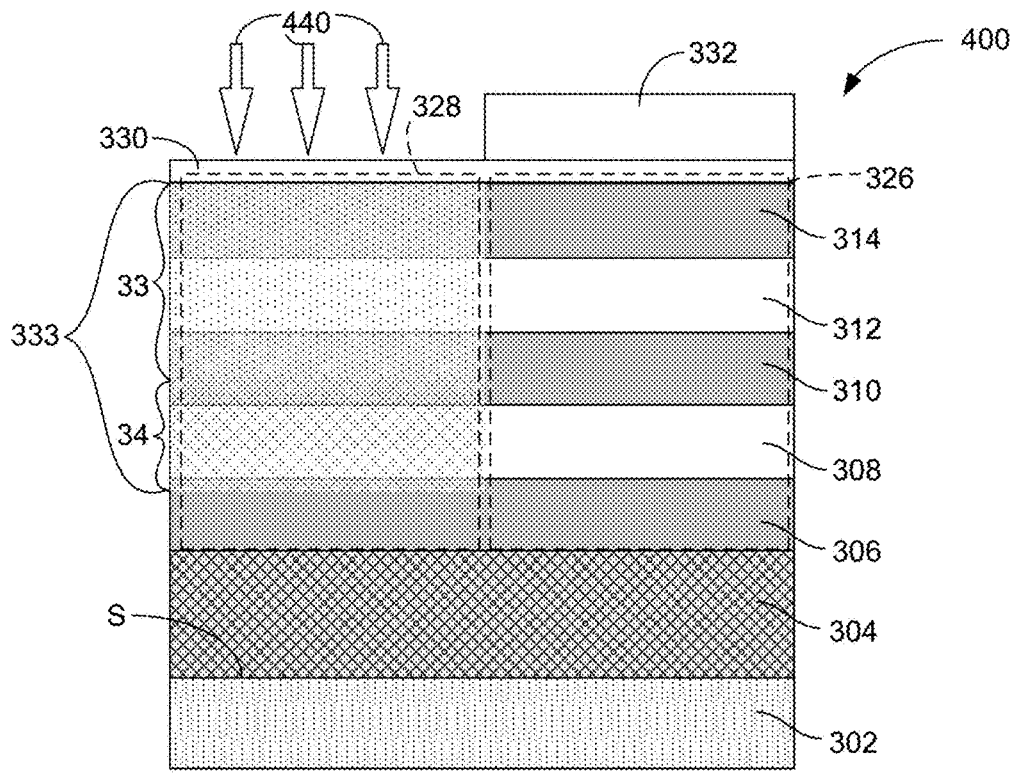
FIG. 4 schematically illustrates a cross-section side view of a stack of layers of a PCM device being selectively doped with an impurity, in accordance with some embodiments.

Generally, an implant direction of the impurity 333 towards the one or more layers 306, 308, 310, 312, 314 may be in a direction indicated by arrows 440 of FIG. 4 that is substantially perpendicular to a surface, S, of the substrate 302 and may include other directions such as, for example, any implant angle from $-89°$ to $+89°$ (e.g., relative to direction indicated by arrows 440) for beam line implant process. A concentration profile of the impurity 333 in the one or more layers 306, 308, 310, 312, 314 may depend on a species, energy, and dose of the impurity as described further in connection with FIG. 4.

In some embodiments, the SD layer 308 may be doped with the impurity 333. In experimentation, it was found that up to 40% vertical leakage reduction in a dummy cell could be obtained by implanting the SD layer 308. In some embodiments, a concentration profile of the impurity 333 in the SD layer 308 may be greater than a concentration of the impurity 333 in other layers (e.g., layers 306, 310, 312, 314). In such embodiments, the layers 310, 312 and 314 may have a concentration of the impurity 333 that is greater than zero because the impurity 333 may pass through and embed in these layers 310, 312 and 314 during implantation of the SD layer 308.

In some embodiments, more or fewer of the layers 306, 308, 310, 312, and 314 may be doped with the impurity 333 than depicted. For example, in some embodiments, the bottom electrode layer 306 may be doped with the impurity 333. In other embodiments, only the layers 310, 312 and 314 may be doped with the impurity 333. In other embodiments, only the layers 312 and 314 may be doped with the impurity.

According to various embodiments, a wide variety of suitable impurities may be used to dope the individual PCM element 316A of the PCM device 300, and both beam line implant and plasma implant technology may be used for the implant process. In some embodiments, the impurity 333 may include one or more of arsenic (As), germanium (Ge), oxygen (O), silicon (Si), carbon (C), boron (B), Argon (Ar), Phosphorous (P), Hydrogen (H), Fluorine (F), Selenium (Se), Indium (In) and nitrogen (N). In some embodiments, the layers 306, 308, 310, 312 and/or 314 may be doped with a same impurity 333. In other embodiments, the layers 306, 308, 310, 312, and/or 314 may be doped with different impurities (e.g., having different chemical composition). The layers 306, 308, 310, 312 and/or 314 may be doped with other suitable impurities in other embodiments.

According to various embodiments, the electrode layers 306, 310 and 314 may be composed of carbon (C). The electrode layers 306, 310 and 314 may be tuned by implant as well as physical vapor deposition (PVD) process for resistivity, smoothness, and C-bonding (sp2 or sp3). In some embodiments, the electrode layers 306, 310 and/or 314 may be composed of one or more conductive and/or semiconductive materials having a resistivity ranging from 1 milli-Ohm·centimeter (mOhm·cm) to 100 mOhm·cm such as, for example, carbon (C), carbon nitride ($C_xN_y$); n-doped polysilicon and p-doped polysilicon; metals including Al, Cu, Ni, Cr, Co, Ru, Rh, Pd, Ag, Pt, Au, Ir, Ta, and W; conductive metal nitrides including TiN, TaN, WN, and TaCN; conductive metal silicides including tantalum silicides, tungsten silicides, nickel silicides, cobalt silicides and titanium silicides; conductive metal silicide nitrides including TiSiN and WSiN; conductive metal carbide nitrides including TiCN and WCN; and conductive metal oxides including $RuO_2$.

According to various embodiments, the PM layer 312 may be composed of a phase-change material such as a chalcogenide glass that can be switched between crystalline and amorphous states with the application of heat produced by an electric current. For example, a chalcogenide glass may comprise an alloy including at least two of the elements among germanium, antimony, tellurium, silicon, indium, selenium, sulfur, nitrogen and carbon According to various embodiments, the SD layer 308 may include a P-N diode, an MIEC (Mixed Ionic Electronic Conduction) device or an OTS (Ovonic Threshold Switch) based on chalcogenide alloys with composition including any one of the chalcogenide alloy systems described for the storage element (e.g., the PM layer 312) and, in addition, may further include an element that can suppress crystallization. The layers 306, 308, 310, 312 and 314 may be composed of other suitable materials having other suitable properties in other embodiments.

The PCM device 300 may further include a dielectric liner 318 conformally deposited on surfaces of the stack of layers of the individual PCM elements 316, as can be seen. A dielectric fill material 320 may be deposited on the dielectric liner 318 to fill the region between the individual PCM elements 316 using any suitable technique. In some embodiments, the dielectric liner 318 may be composed of silicon nitride ($Si_3N_4$ or in general $Si_xN_y$, where x and y represent any suitable relative quantity) and the dielectric fill material 320 may be composed of silicon oxide ($SiO_2$). The dielectric liner 318 and the dielectric fill material 320 may be composed of other suitable materials in other embodiments.

The PCM device 300 may further include a bit-line 324 coupled with the individual PCM elements 316, as can be seen. In some embodiments, the bit-line 324 may be electrically and/or directly coupled with the top electrode 314.

The bit-line 324 may be composed of any suitable metal including, for example, tungsten and may be deposited using any suitable technique.

In some embodiments, the PCM device 300 may represent a bit-line socket having a width from about 30 microns to about 50 microns and/or including a two-transistor (2T) decoding scheme.

FIG. 4 schematically illustrates a cross-section side view of a stack of layers 306, 308, 310, 312, and 314 of a PCM device 400 being selectively doped (e.g., indicated by arrows 440) with an impurity 333, in accordance with some embodiments. The PCM device 400 may be depicted subsequent to deposition of the stack of layers 306, 308, 310, 312, and 314 and prior to patterning of the stack of layers 306, 308, 310, 312, and 314 and the word-line 304.

In some embodiments, each layer of the stack of layers 306, 308, 310, 312, and 314 may be sequentially deposited to form the stack of layers 306, 308, 310, 312, and 314. An implant film 330 may be deposited on the stack of layers to provide metal contamination control (e.g., to prevent sputtering of materials of the stack of layers 306, 308, 310, 312 and 314 into the environment of the implant equipment). In some embodiments, the implant film 330 may comprise a silicon oxide (e.g., $SiO_2$) film having a thickness ranging from 40 Angstroms to 100 Angstroms. The implant film 330 may be composed of other suitable materials or have other thicknesses in other embodiments. Subsequent to implant, the implant film 330 may be removed using any suitable technique including, for example, etch processes.

In some embodiments, a mask layer 332 may be deposited on the stack of layers 306, 308, 310, 312, and 314 and patterned such that the patterned mask layer 332 is configured to protect a region 326 where active cells (e.g., individual PCM element 316B of FIG. 3) are to be formed. An opening may be patterned in the mask layer 332 over a region 328 where dummy cells (e.g., individual PCM element 316A of FIG. 3) are to be formed. The mask layer 332 may include any suitable material including hardmask materials such as, for example, silicon oxide or photosensitive materials such as, for example, photoresist. Subsequent to implant, the mask layer 332 may be removed using any suitable technique including, for example, etch processes.

One or more layers of the stack of layers 306, 308, 310, 312, and 314 in the region 328 may be doped with an impurity 333 using an implant process. For example, in some embodiments, implant of the impurity 333 may be tuned to target the SD layer 308 (e.g., provide a higher concentration of the impurity 333 in the SD layer 308 than other layers such as the PM layer 312). In some embodiments, a concentration 34 of the impurity 333 in the SD layer 308 may be greater than a concentration 33 of the impurity 333 in the PM layer 312 and/or top electrode layer 314 and middle electrode layer 310. Tuning the implant may include characterizing dose, energy and species of various impurities through a stack of layers and measuring concentration of the impurity in the respective layers to determine a dose, energy and/or species for implant. Measuring may be performed, for example, by secondary ion mass spectrometry (SIMS) or energy-dispersive X-ray spectroscopy (EDS). Both beam line implant and plasma implant technology can be used for the implant process. The impurity 333 may include one or more of arsenic (As), germanium (Ge), oxygen (O), silicon (Si), carbon (C), boron (B), Argon (Ar), Phosphorus (P), Hydrogen (H), Fluorine(F), Selenium(Se), Indium(In) and nitrogen (N), according to various embodiments. The implant dose could be from 1E14 to 1E17 atoms/cm2 and/or the implant energy could be from 500 eV to 80 keV, according to some embodiments. In some embodiments, the impurity 333 may include Si or C. Other suitable impurities and dose/energy may be used in other embodiments.

In other embodiments, implant of the impurity 333 may be performed during other stages of fabrication of the PCM device 400. For example, in some embodiments, the impurity 333 may be implanted subsequent to depositing the SD layer 308 and prior to depositing the middle electrode layer 310 in a region where dummy cells are to be formed (e.g., using a mask layer 332 on the SD layer 308). In other embodiments, the impurity 333 may be implanted subsequent to depositing another layer of the stack of layers 306, 308, 310, 312 and 314 and prior to depositing the top electrode layer 314. In other embodiments, the impurity 333 may be implanted subsequent to patterning the stack of layers 306, 308, 310, 312 and 314 to form trenches where the dielectric materials 318 and 320 are disposed in FIG. 3 and prior to depositing the dielectric materials 318 and 320. In other embodiments, the impurity 333 may be implanted subsequent to forming the array of cells (e.g., individual PCM elements 316A, 316B) and prior to depositing the bit-line 324.

Figure 5:
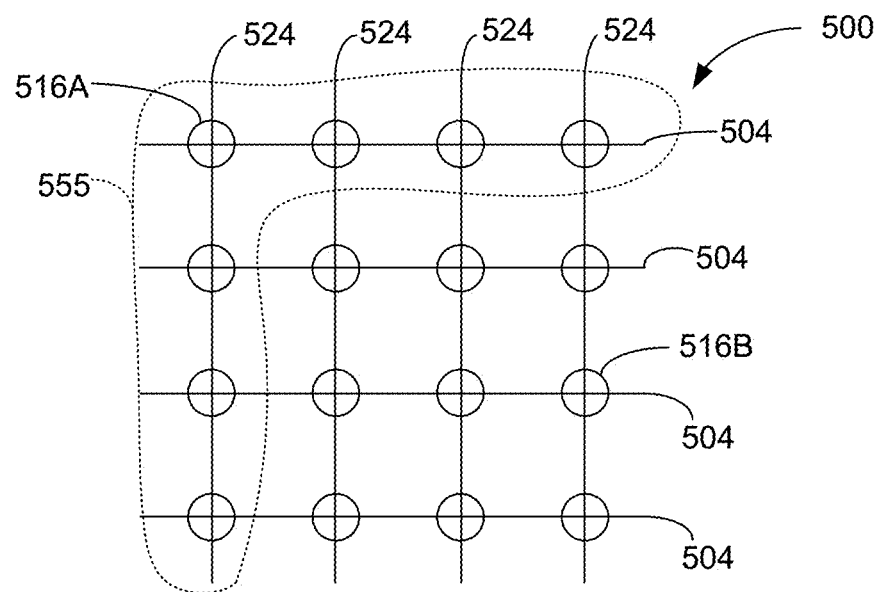
FIG. 5 schematically illustrates an array of cells of a PCM device including active cells and dummy cells, in accordance with some embodiments.

FIG. 5 schematically illustrates an array of cells of a PCM device including active cells 516B and dummy cells 516A, in accordance with some embodiments. The array may represent a single tile 500 in some embodiments. The tile 500 may be treated as a discrete unit during a selection operation of a target cell. That is, in some embodiments, the tile 500 may be a unit of an array of cells that is biased to select a target cell (e.g., a bit) in the array. In the depicted embodiment, the tile 500 includes cells (e.g., active cells 516B and dummy cells 516A) disposed at an intersection of four word-lines 504 and four bit-lines 524 (4 WL×4 BL); however, other suitable tile sizes can be used in other embodiments.

According to various embodiments, the dummy cells 516A (e.g., within region 555) may be disposed at an edge of the tile 500, as can be seen. The active cells 516B may be electrically coupled with the dummy cells 516A via the word-lines 504 and the bit-lines 524 and may be similarly biased during select or other operations. In some embodiments, the dummy cells 516A may be doped with an impurity to reduce leakage as described herein and the active cells 516B may not be doped with the impurity. The dummy cells 516A may comport with embodiments described in connection with individual PCM element 316A of FIG. 3 and the active cells 516B may comport with embodiments described in connection with individual PCM element 316B of FIG. 3.

Figure 6:
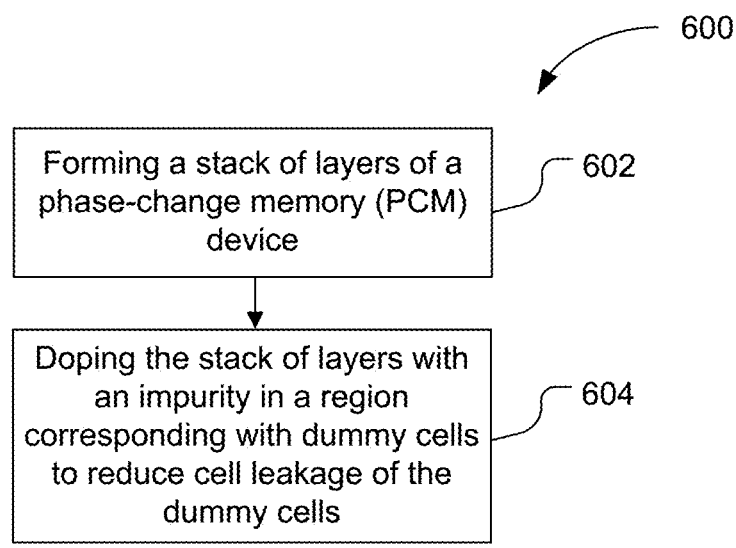
FIG. 6 is a flow diagram of a method of fabricating a PCM device, in accordance with some embodiments.

FIG. 6 is a flow diagram of a method 600 of fabricating a PCM device (e.g., PCM device 300 of FIG. 3), in accordance with some embodiments. The method 600 may comport with embodiments described in connection with FIGS. 1-5 and vice versa.

At 602, the method 600 may include forming a stack of layers (e.g., stack of layers 306, 308, 310, 312, and/or 314 of FIG. 4) of a phase-change memory (PCM) device (e.g., PCM device 400 of FIG. 4). The stack of layers may be formed by depositing a bottom electrode layer (e.g., bottom electrode layer 306) on a word-line metal layer (e.g., word-line 304 of FIG. 3), depositing a select device layer (e.g., SD layer 308 of FIG. 3) on the bottom electrode layer, depositing a middle electrode layer (e.g., middle electrode layer 310 of FIG. 3) on the select device layer, depositing a phase-change material layer (e.g., PM layer 312 of FIG. 3) on the middle electrode layer and/or depositing a top electrode layer (e.g., top electrode layer 314 of FIG. 3) on the phase-change material layer, using any suitable deposition technique, according to various embodiments.

At 604, the method 600 may include doping (e.g., indicated by arrows 440 of FIG. 4) the stack of layers with an impurity (e.g., impurity 333 of FIG. 4) in a region (e.g., region 328 of FIG. 4 or region 555 of FIG. 5) corresponding with dummy cells (e.g., individual PCM element 316A of FIG. 3) to reduce cell leakage of the dummy cells. In some embodiments, a region (e.g., region 326 of FIG. 4) of active cells (e.g., active cells 516B) may be protected by a patterned mask layer (e.g., mask layer 332 of FIG. 4) such that the active cells are not doped with the impurity during the doping of the stack of layers.

In some embodiments, doping the stack of layers includes doping the phase-change material layer. In other embodiments, the doping may be configured to introduce the impurity into other regions of the stack of layers including, for example, the select device layer. For example, the doping may be performed on a stack of layers including the select device layer and the phase-change material layer, and the doping of the phase-change material layer and the select device layer may be simultaneously performed during a same implant process of the impurity (e.g., a same impurity). In some embodiments, doping the select device layer may provide a higher concentration of the impurity in the select device layer than a concentration of the impurity in the phase-change material layer. For another example, the stack of layers may include only a select device layer on the bottom electrode layer when the select device layer is doped, in some embodiments. Other configurations of the stack of layers may be doped with an impurity as described herein.

Various operations are described as multiple discrete operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order than the described embodiment. Various additional operations may be performed and/or described operations may be omitted in additional embodiments.

Figure 7:
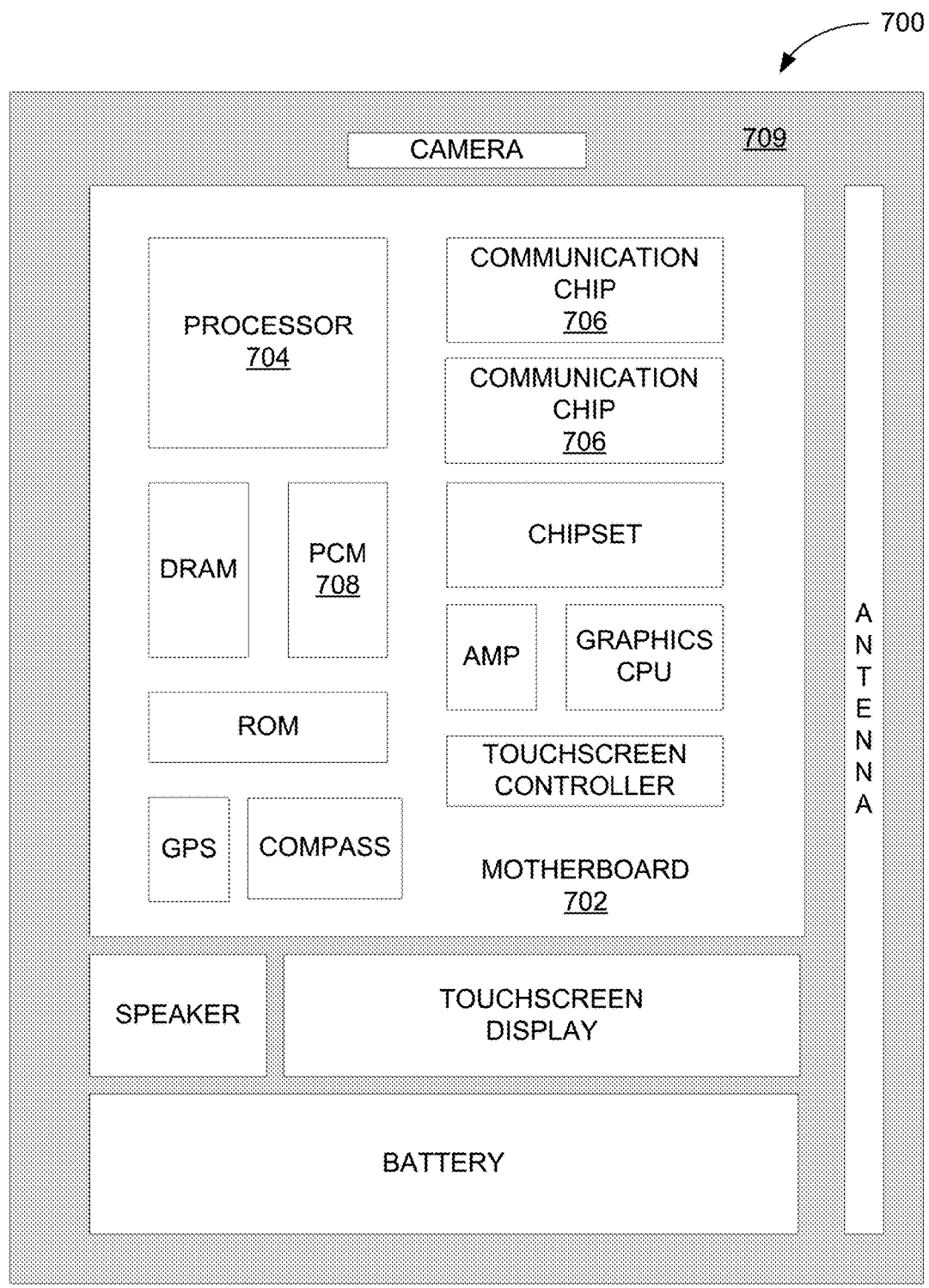
FIG. 7 schematically illustrates an example system that includes a PCM device in accordance with various embodiments described herein.

Embodiments of the present disclosure may be implemented into a system using any suitable hardware and/or software to configure as desired. FIG. 7 schematically illustrates an example system (e.g., computing device 700 of FIG. 7) that includes a PCM device (e.g., PCM device 300 of FIG. 3), in accordance with various embodiments described herein. The computing device 700 may house (e.g., in housing 709) a board such as motherboard 702. The motherboard 702 may include a number of components, including but not limited to a processor 704 and at least one communication chip 706. The processor 704 may be physically and electrically coupled to the motherboard 702. In some implementations, the at least one communication chip 706 may also be physically and electrically coupled to the motherboard 702. In further implementations, the communication chip 706 may be part of the processor 704.

Depending on its applications, computing device 700 may include other components that may or may not be physically and electrically coupled to the motherboard 702. These other components may include, but are not limited to, volatile memory (e.g., dynamic random access memory (DRAM)), non-volatile memory (e.g., PCM 708 or read only memory (ROM)), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, a Geiger counter, an accelerometer, a gyroscope, a speaker, a camera, and a mass storage device (such as hard disk drive, compact disk (CD), digital versatile disk (DVD), and so forth).

According to various embodiments, the PCM 708 may comport with embodiments described herein. For example, the PCM 708 may include a PCM device (e.g., PCM device 300 of FIG. 3) as described herein.

The communication chip 706 may enable wireless communications for the transfer of data to and from the computing device 700. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 706 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible BWA networks are generally referred to as WiMAX networks, an acronym that stands for Worldwide Interoperability for Microwave Access, which is a certification mark for products that pass conformity and interoperability tests for the IEEE 802.16 standards. The communication chip 706 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 706 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 706 may operate in accordance with Code Division Multiple Access (CDMA), Time Division Multiple Access (TDMA), Digital Enhanced Cordless Telecommunications (DECT), Evolution-Data Optimized (EV-DO), derivatives thereof, as well as any other wireless protocols that are designated as 3G, 4G, 5G, and beyond. The communication chip 706 may operate in accordance with other wireless protocols in other embodiments.

The computing device 700 may include a plurality of communication chips 706. For instance, a first communication chip 706 may be dedicated to shorter range wireless communications such as Wi-Fi and Bluetooth, and a second communication chip 706 may be dedicated to longer range wireless communications such as GPS, EDGE, GPRS, CDMA, WiMAX, LTE, EV-DO, and others.

In various implementations, the computing device 700 may be mobile computing device, a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 700 may be any other electronic device that processes data.

EXAMPLES

According to various embodiments, the present disclosure an apparatus. Example 1 of an apparatus may include a plurality of phase-change memory (PCM) elements, wherein individual PCM elements of the plurality of PCM elements are dummy cells including a bottom electrode layer, a select device layer disposed on the bottom electrode layer, a middle electrode layer disposed on the select device layer, a phase-change material layer disposed on the middle electrode layer and a top electrode layer disposed on the phase-change material layer, wherein the phase-change material layer is doped with an impurity to reduce cell leakage of the dummy cells. Example 2 may include the apparatus of example 1, wherein the select device layer is doped with an impurity to reduce cell leakage of the dummy cells. Example 3 may include the apparatus of example 2, wherein the select device layer and the phase-change material layer are doped with a same impurity. Example 4 may include the apparatus of example 3, wherein the select device layer has a higher concentration of the impurity than the phase-change material layer. Example 5 may include the apparatus of any of examples 1-4, wherein the phase-change material layer and the select device layer comprise a chalcogenide material and the impurity is selected from a group consisting of arsenic (As), germanium (Ge), oxygen (O), silicon (Si), carbon (C), boron (B), and nitrogen (N). Example 6 may include the apparatus of example 5, wherein the impurity is Si, C, or Ge. Example 7 may include the apparatus of example 6, wherein the impurity is Si. Example 8 may include the apparatus of any of examples 1-4, further comprising a tile of cells including an array of cells, wherein the dummy cells are disposed at an edge of the tile. Example 9 may include the apparatus of example 8, wherein active cells of the tile of cells are electrically coupled with the dummy cells and are not doped with the impurity. According to various embodiments, the present disclosure describes a method. Example 10 of a method may include forming a stack of layers of a phase-change memory (PCM) device by depositing a bottom electrode layer on a word-line metal layer, depositing a select device layer on the bottom electrode layer, depositing a middle electrode layer on the select device layer, depositing a phase-change material layer on the middle electrode layer, and doping the phase-change material layer with an impurity in a region of the stack of layers corresponding with dummy cells to reduce cell leakage of the dummy cells. Example 11 may include the method of example 10, further comprising doping the select device layer with an impurity to reduce cell leakage of the dummy cells. Example 12 may include the method of example 11, wherein the select device layer and the phase-change material layer are doped with a same impurity during a same implant process. Example 13 may include the method of example 12, wherein doping the select device layer provides a higher concentration of the impurity in the select device layer than a concentration of the impurity in the phase-change material layer. Example 14 may include the method of any of examples 10-13, wherein the phase-change material layer and the select device layer comprise a chalcogenide material and the impurity is selected from a group consisting of arsenic (As), germanium (Ge), oxygen (O), silicon (Si), carbon (C), boron (B), and nitrogen (N). Example 15 may include the method of example 14, wherein the impurity is Si. Example 16 may include the method of any of examples 10-13, wherein the dummy cells are disposed at an edge of a tile of cells including an array of cells. Example 17 may include the method of example 16, wherein regions of active cells of the tile of cells are protected by a patterned mask layer such that the active cells are not doped with the impurity during the doping of the phase-change material layer. According to various embodiments, the present disclosure describes a system. Example 18 of a system may include a circuit board and a die coupled with the circuit board, the die comprising a plurality of phase-change memory (PCM) elements, wherein individual PCM elements of the plurality of PCM elements are dummy cells including a bottom electrode layer, a select device layer disposed on the bottom electrode layer, a middle electrode layer disposed on the select device layer, a phase-change material layer disposed on the middle electrode layer, and a top electrode layer disposed on the phase-change material layer, wherein the phase-change material layer is doped with an impurity to reduce cell leakage of the dummy cells. Example 19 may include the system of example 18, wherein the select device layer is doped with an impurity to reduce cell leakage of the dummy cells. Example 20 may include the system of example 19, wherein the select device layer has a higher concentration of the impurity than the phase-change material layer. Example 21 may include the system of any of examples 18-20, wherein the system is a mobile computing device including one or more of an antenna, a display, a touchscreen display, a touchscreen controller, a battery, an audio codec, a video codec, a power amplifier, a global positioning system (GPS) device, a compass, a Geiger counter, an accelerometer, a gyroscope, a speaker, or a camera coupled with the circuit board.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

The above description of illustrated implementations, including what is described in the Abstract, is not intended to be exhaustive or to limit the embodiments of the present disclosure to the precise forms disclosed. While specific implementations and examples are described herein for illustrative purposes, various equivalent modifications are possible within the scope of the present disclosure, as those skilled in the relevant art will recognize.

These modifications may be made to embodiments of the present disclosure in light of the above detailed description. The terms used in the following claims should not be construed to limit various embodiments of the present disclosure to the specific implementations disclosed in the specification and the claims. Rather, the scope is to be determined entirely by the following claims, which are to be construed in accordance with established doctrines of claim interpretation.

What is claimed is:

1. A method comprising:
   forming a stack of layers of a phase-change memory (PCM) device comprising a plurality of PCM elements, wherein the plurality of PCM elements include dummy cells and active cells electrically coupled with the dummy cells, wherein forming includes:
   depositing a bottom electrode layer on a word-line metal layer;
   depositing a select device layer on the bottom electrode layer;
   depositing a middle electrode layer on the select device layer; and
   depositing a phase-change material layer on the middle electrode layer; and
   doping the phase-change material layer with an impurity in a region of the stack of layers corresponding to the dummy cells to reduce cell leakage of the dummy cells, wherein the active cells are free from doping with the impurity.

2. The method of claim 1, further comprising:
   doping the select device layer with an impurity to reduce cell leakage of the dummy cells.

3. The method of claim 2, wherein the select device layer and the phase-change material layer are doped with a same impurity during a same implant process.

4. The method of claim 3, wherein doping the select device layer provides a higher concentration of the impurity in the select device layer than a concentration of the impurity in the phase-change material layer.

5. The method of claim 1, wherein:
   the phase-change material layer and the select device layer comprise a chalcogenide material; and
   the impurity is selected from a group comprising arsenic (As), germanium (Ge), oxygen (O), silicon (Si), carbon (C), boron (B), Argon (Ar), Phosphorous (P), Hydrogen (H), Fluorine (F), Selenium (Se), Indium (In) and nitrogen (N).

6. The method of claim 5, wherein the impurity is Si.

7. The method of claim 1, wherein the dummy cells are disposed at an edge of a tile of cells including an array of cells.

8. The method of claim 7, further comprising: protecting regions of the active cells of the tile of cells by a patterned mask layer such that the active cells are not doped with the impurity during the doping of the phase-change material layer.

* * * * *